(12) United States Patent
Bowen et al.

(10) Patent No.: US 6,933,536 B2
(45) Date of Patent: Aug. 23, 2005

(54) METHOD FOR FABRICATING FIDUCIALS FOR PASSIVE ALIGNMENT OF OPTO-ELECTRONIC DEVICES

(75) Inventors: Terry Patrick Bowen, Etters, PA (US); William Sean Ring, Ringoes, NJ (US); Ching-Long Jiang, Belle Mead, NJ (US); Randall B. Wilson, Warren, NJ (US); Mark S. Soler, Santa Barbara, CA (US); John Baker Breedis, Boston, MA (US); Richard Anderson, Etters, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/659,448

(22) Filed: Sep. 9, 2003

(65) Prior Publication Data

US 2004/0048404 A1 Mar. 11, 2004

Related U.S. Application Data

(60) Division of application No. 09/982,382, filed on Oct. 18, 2001, now Pat. No. 6,625,357, which is a continuation-in-part of application No. 09/277,909, filed on Mar. 29, 1999, now abandoned.

(51) Int. Cl.[7] .............................................. H01L 33/00
(52) U.S. Cl. .......................... 257/98; 257/797; 438/29; 438/39
(58) Field of Search .............................. 257/98; 385/88

(56) References Cited

U.S. PATENT DOCUMENTS 5,511,089 A * 4/1996 Yamada ........................ 372/45
6,222,206 B1 * 4/2001 Chirovsky et al. ............ 257/98

* cited by examiner

*Primary Examiner*—Douglas A. Wille

(57) ABSTRACT

The present invention relates to a technique for fabricating a mechanical or visual alignment fiducial on a laser die particularly adapted for application with a laser die that is a buried structure edge emitting laser. In fabricating the device, the fiducial and the active mesa are formed in the same photolithography patterning step, using conventional techniques. The active is then buried with regrowth layers. The regrowth layers are subsequently selectively etched to expose the fiducial, leaving the active region protected and buried.

14 Claims, 20 Drawing Sheets

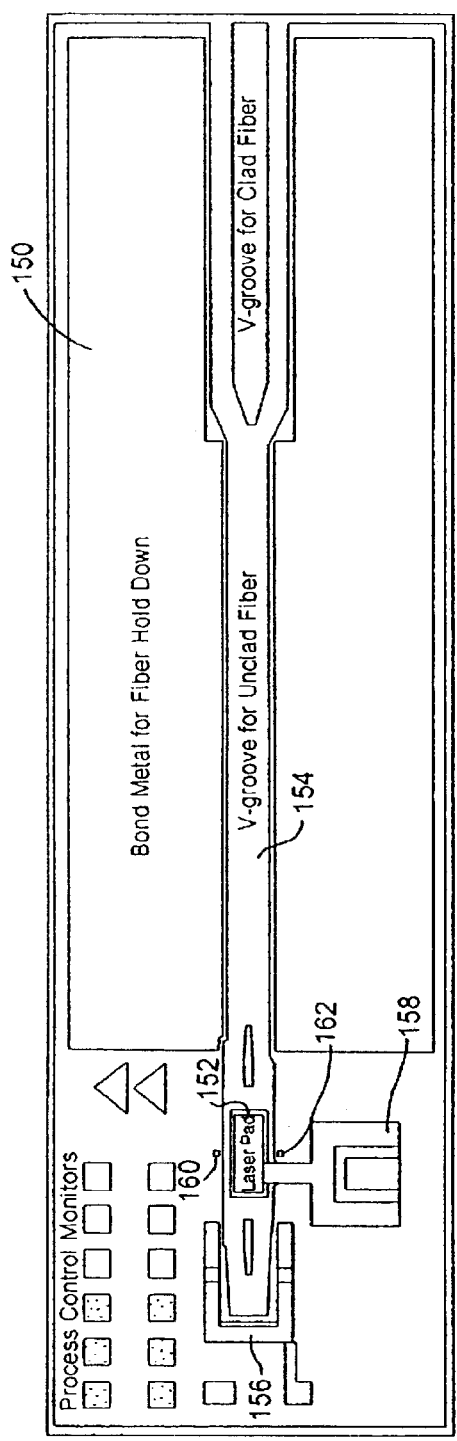
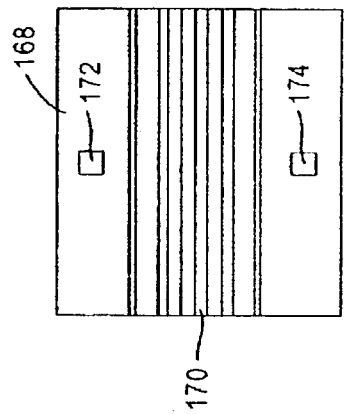
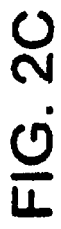
FIG. 2A
FIG. 2B
FIG. 2C

METHOD FOR FABRICATING FIDUCIALS FOR PASSIVE ALIGNMENT OF OPTO-ELECTRONIC DEVICES

RELATED APPLICATION

The present application is a division of application Ser. No. 09/982,382, filed Oct. 18, 2001, now U.S. Pat. No. 6,625,357, which is a continuation-in-part of U.S. patent application Ser. No. 09/277,909, filed Mar. 29, 1999, now abandoned, which is incorporated herein by reference.

FIELD OF THE INVENTION

The present invention relates to a technique for fabricating fiducials in a buried heterostructure edge emitting laser for alignment of the device in a passive manner.

BACKGROUND OF THE INVENTION

The present invention is related to U.S. Pat. No. 5,981,975 to Imhoff, filed Feb. 27, 1998 as well as to U.S. patent application Ser. No. 60/079,910 filed on Mar. 30, 1998, the disclosures of which are specifically incorporated herein by reference. Light emitting devices often utilize double heterostructures or multi-quantum well structures in which an active region of a III–V semiconductor is sandwiched between two oppositely doped III–IV compounds. By choosing appropriate materials for the outer layers, the band gaps are made to be larger than that of the active layer. This procedure, well known to one of ordinary skill in the art, produces a device that permits light emission due to recombination in the active region, but prevents the flow of electrons or holes between the active layer and the higher band gap sandwiching layers due to the differences between the conduction band energies and the valence band energies, respectively. Light emitting devices can be fabricated to emit from the edge of the active layer, or from the surface. Typically, a first layer of material, the substrate, is n-type indium phosphide (InP) with an n-type buffer layer disposed thereon. This buffer layer again is preferably InP. The active layer is typically indium gallium arsenide phosphide (InGaAsP) with a p-type cladding layer of InP disposed thereon. One potential pitfall of double heterostructure lasers is often a lack of means for confining the current and the radiation emission in the lateral direction. The result is that a typical broad area laser can support more than one transverse mode, resulting in unacceptable mode hopping as well as spatial and temporal instabilities. To overcome these problems, modern semiconductor lasers employ some form of transverse optical and carrier confinement. A typical structure to effect lateral confinement is the buried heterostructure laser. The buffer, active and cladding layers are disposed on the substrate by epitaxial techniques. The structure is then etched through a mask down to the substrate level leaving a relatively narrow (roughly on the order of several microns) rectangular mesa composed of the original layers. A burying layer is then regrown on either side of the mesa resulting in the buried heterostructure device. The important feature of a buried heterostructure laser is that the active layer is surrounded on all sides by a lower index material so that from an electromagnetic perspective the structure is that of a rectangular dielectric waveguide. The lateral and transverse dimensions of the active region and the index discontinuities are chosen so that only the lowest order transverse mode can propagate in the waveguide. Another very important feature of the structure and that which is required to effect lasing is the confinement of injected carriers at the boundaries of the active region due to the energy band discontinuities at the interface of the active region and the InP layers. These act as potential barriers inhibiting carrier escape out of the active region.

One area of optoelectronics which has seen a great deal of activity in the recent past is in the area of passive alignment. Silicon waferboard, which utilizes the crystalline properties of silicon for aligning optical fibers, as well as passive and active optical devices, has gained a great deal of acceptance. One technique for aligning an optoelectronic device to an optical fiber and other passive and/or active elements is the use of an alignment pedestal for lateral planar registration and standoffs for height registration. By virtue of the sub-micron accuracy of photolithography used to define and align these pedestals and standoff features, the application of this approach has proven to be a viable alignment alternative. By effecting alignment in a passive manner, the labor input into the finished product can be reduced, resulting in lower cost of the final product.

One example of such an alignment scheme can be found in U.S. Pat. No. 5,163,108 to Armiento, et al., the disclosure of which is specifically incorporated herein by reference. The reference to Armiento, et al. makes use of an alignment notch on the active device which is designed to mate with alignment pedestals and standoffs on the silicon waferboard. This particular structure is used for aligning an optical fiber array to an array of light emitting devices.

FIG. 1 is a perspective view of a laser array die 102 which is to be mounted on a silicon substrate 100 such that the active region 106 of the laser die 102 accurately aligns with a fiber to be placed in a v-groove 105 on the silicon substrate 100. As shown, the die 102 has a notch 101 that has been etched therein to be an accurately controlled distance from the laser active region 106. Further, pedestals 103, 104, 108, and 109 have been fabricated on the substrate at predetermined locations to serve as mechanical fiducials for the laser die 102, i.e., the laser will be aligned by virtue of contact with the fiducial. In particular, the laser die is placed on the silicon substrate 100 generally in the vicinity of fiducials 103, 104, 108, and 109 so that the active region 106 roughly aligns with the v-groove 105. The laser die 102 is then pushed in the z direction so that the front surface 107 of the die 102 abuts mechanical fiducials 108 and 109 and in the x direction so that the surface 112 of notch 101 abuts the surface 113 of mechanical fiducial 103, thereby precisely aligning the laser die 102 on the silicon in the x and z directions in a position dictated by the placement of the mechanical fiducials 103, 104, 109, and 110, (and notch 101).

Unfortunately, one problem with structures like the one shown in the reference to Armiento, et al., is that it pertains only to ridge laser structures. This is because, in a ridge waveguide laser structure, the patterning photolithography step that defines the active waveguide is simultaneously used to define the alignment notch in the same mask level, resulting in an alignment of the notch and active waveguide that is limited only by the variations in the photolithography mask. However, it is advantageous from a performance standpoint to be able to utilize lasers and other active devices that incorporate a regrowth step, such as the buried heterostructure laser described above. For this class of devices, the subsequent regrowth step(s), bury the active waveguide mesa and, hence, also the notch. Accordingly, fabrication is complicated because the alignment notch must be made after the regrowth since the notch patterning step must occur in a photolithography step subsequent to the one in which the active waveguide is defined. Moreover, a notch patterning step on the regrown surface of the wafer is difficult because the mesa is not a visible re-alignment feature using the conventional technique of optical alignment methods. Even further, creating the notch using a different photolithography step and mask than was used to create the mesa increases the potential misalignment between the mesa and the notch. Particularly, in such situations, the tolerances of the masks are essentially cumulative. Further, additional error is introduced by misalignment of the masks to one another.

Another known scheme for passively aligning an optoelectronic device to an optical fiber on a silicon waferboard is the use of visual fiducials and an optical detection system. In this technique, visible markings (the fiducials) are made on the surfaces of the optoelectronic device and mating markings are made on the silicon waferboard. The visual fiducials usually are made by etching through at least the outermost layer of the optoelectronic device and the silicon waferboard to leave an aperture that can be detected by an optical detection system. The fiducials are placed on the optoelectronic device and the silicon waferboard in a pattern so that when the optoelectronic device is positioned on the silicon waferboard so that the fiducials on the optoelectronic device perfectly overlay the mating fiducials on the silicon waferboard, the two are properly aligned.

An optical detection system detects the visual fiducials on the waferboard and optoelectronic device and then controls stepper motors or equivalent means that align the optoelectronic device with the waferboard so that the fiducials properly mate with each other, thereby resulting in proper alignment in at least two dimensions of the optoelectronic device on the silicon waferboard. The fiducial marks should be two dimensional, such as x's or squares so as to provide visual reference cues in at least two orthogonal directions. Further, typically two or more separate fiducial marks that are spaced from each other are utilized on each of the optoelectronic device and the waferboard. The use of two or more spaced visual fiducials provide for greater accuracy in alignment, particularly angular rotation about the y axis. Particularly, the more individual fiducial marks and/or the further apart they are from each other, that smaller will be any angular rotation errors due to tolerance limits and the like.

FIG. 2A through 2C illustrate the concept of visual fiducials. FIG. 2A is a plan view of a silicon waferboard adapted to mate a semiconductor laser to a fiber in a v-groove of a silicon waferboard. FIG. 2B is a close up of the portion of the waferboard surrounding the laser pad and FIG. 2C is a plan view of the laser die. The waferboard 150 includes a laser bond pad 152 on which the semiconductor laser 168 is to be mounted and a v-groove 154 within which the fiber is to be placed. Also shown for sake of completeness are a solder metalization 156 for a monitor pin behind the laser and a wire bond pad 158 for electrically coupling the laser to circuitry (not shown) on or off the silicon waferboard 150. Visual fiducials in the form of squares are shown at 160 and 162 on opposite sides of the laser pad 152. These squares actually comprise holes etched through the various layers of the silicon waferboard.

On laser die 168, strip 170 running longitudinally in the center of the die is the active region of the laser. Mating fiducial marks 172 and 174 are etched in at least the outermost layer of the semiconductor laser die. Visual fiducials 172 and 174 are shaped and positioned to exactly mate with visual fiducials 160 and 162 on the semiconductor die. All four fiducials are positioned such that, when fiducial 172 exactly overlays fiducial 160 and fiducial 174 exactly overlays fiducial 162, active region 170 of the laser die will precisely align with the core of a fiber placed in v-groove 154.

During assembly, the visual fiducial approach is implemented using a bonding system that is capable of imaging the optical device (particularly, fiducials 172 and 174) and the substrate fiducials 160 and 162. By suitable means, the optical device placement is affected such that the optical device fiducials 172 and 174 lie at a specified location relative to the substrate fiducials (typically directly atop one another). Such a process can be performed either automatically or manually. On completion of the device bond, the active region 170 will precisely align with the core of a fiber placed in the v-groove 154.

Obviously, the accuracy with which the active region 170 of the laser die mates with the core of the fiber placed in v-groove 154 depends on many factors. For instance, it depends on the accuracy of the bonding system used to place the die on the substrate. Also of great importance is the placement accuracy of the visual fiducials on the substrate wafer and on the laser die. This placement accuracy, in turn, depends upon the accuracy of the individual process masks used to define the visual fiducials and on the number of process steps used to fabricate them. As the number of process steps increases, fiducial location errors increase owing to the accumulation of errors within the individual process masks and to any alignment errors between the individual process steps.

Another well known passive alignment technique involves the use of metal pads formed on the surface of the silicon waferboard and mating metal pads formed on the surface of the optoelectronic device. Solder (or other wettable material such as brazing alloy, Babbit metals, amalgams and even certain thermoplastic polymers) is placed on the pads of either the waferboard or the optoelectronic device die or both. Then, the optoelectronic device is roughly aligned with and placed on the waferboard so that the mating pads are in contact, where this initial placement need not be particularly accurate. The solder is then reflowed (reheated to a molten state) whereby final alignment is effected by the inherent reduction in the surface tension within a liquid medium, the net effect being to draw the mating metal pads into accurate alignment with each other.

Just as discussed above in connection with the visual fiducial technique for passive alignment, the accuracy of this technique is highly dependent on the accuracy of the placement of the metalization pads, which, again, is adversely affected as the number of photolithography steps that are cumulatively relied upon in aligning the metal pads relative to the active region of the laser increases.

Accordingly, it is an object of the present invention to provide an improved technique for passively aligning an optoelectronic device with a fiber.

Accordingly, it is another object of the present invention to provide an improved technique for passively aligning a buried heterostructure laser with a fiber.

It is another object of the present invention to provide an improved method and apparatus for aligning an optoelectronic device on a mounting substrate, such as a silicon waferboard.

It is a further object of the present invention to provide an improved method for creating mechanical fiducials, visual fiducials and/or metalizations on an optoelectronic device.

SUMMARY OF THE INVENTION

The present invention relates to a technique for fabricating a mechanical alignment fiducial or visual alignment fiducial on a laser die particularly adapted for application with a laser die that is a buried structure edge emitting laser.

In fabricating the device, a laser base structure consisting of (1) a buffer layer, (2) a bulk or multiple quantum well (MQW) active layer, (3) a cladding layer, and (4) a thin etch-stop alignment layer. A dielectric, such as $SiO_2$ or $Si_3N_4$, is deposited over the wafer. A photolithography patterning step, using conventional techniques, is used to simultaneously define openings in the $SiO_2$ or $Si_3N_4$ etching mask corresponding to the mechanical alignment fiducial or visual fiducial and to the laser waveguide mesa.

A reactive ion or other suitable etching technique is then used to etch through the etch-stop alignment layer, cladding layer, and active layer of the underlying structure to simultaneously define the mechanical or visual fiducial and the laser waveguide mesa. Photoresist is next applied and patterned such that the region in the vicinity of the alignment notch is protected with photoresist, while the active mesa region is exposed for a subsequent etching step to further define the active mesa. After the final mesa etching step, which utilizes an etchant which does not attack photoresist, the remaining photoresist is removed, leaving a structure which now incorporates a precisely located etch-stop alignment layer that can serve as a mechanical or visual fiducial, upon which additional regrowths may be performed using conventional LPE or MOCVD techniques. This incorporated layer now functions as a precise etching mask for material selective etchants, such as HCl.

Next either a conventional unmasked LPE regrowth or a conventional masked MOCVD regrowth step is performed to complete the structure. The regrowth typically consists of several appropriately doped InP layers, followed by a capping layer of, for example, InGaAs or InGaAsP. A final patterning and selective etching step is used to expose the etch-stop alignment layer bearing an accurately aligned notch at the outer edge of this layer. The precisely located surfaces of the etch-stop alignment layer can serve as either mechanical or visual fiducials. For instance, the laser can be positioned and pushed up against mating mechanical fiducials on a silicon waferboard. Alternately, the fiducials can be made to have two dimensional features and can be used as visual fiducials for use in connection with an optical alignment technique. Even further, the fiducials can be used as visual fiducials for precise alignment of metal pads that are formed on the optoelectronic device die, which metal pads will be used for later alignment of the die on a substrate using solder re-flow or other similarly principled techniques.

BRIEF DESCRIPTION OF THE DRAWINGS

FIG. 2A is a plan view of a substrate of a silicon waferboard with visual fiducials.

FIG. 2B is a close up of a portion of FIG. 2A including a laser mounting pad.

FIG. 2C is a plan view of a semiconductor laser die for mounting on the silicon waferboard of FIGS. 2A and 2B.

DETAILED DESCRIPTION OF THE INVENTION

Figure 3:
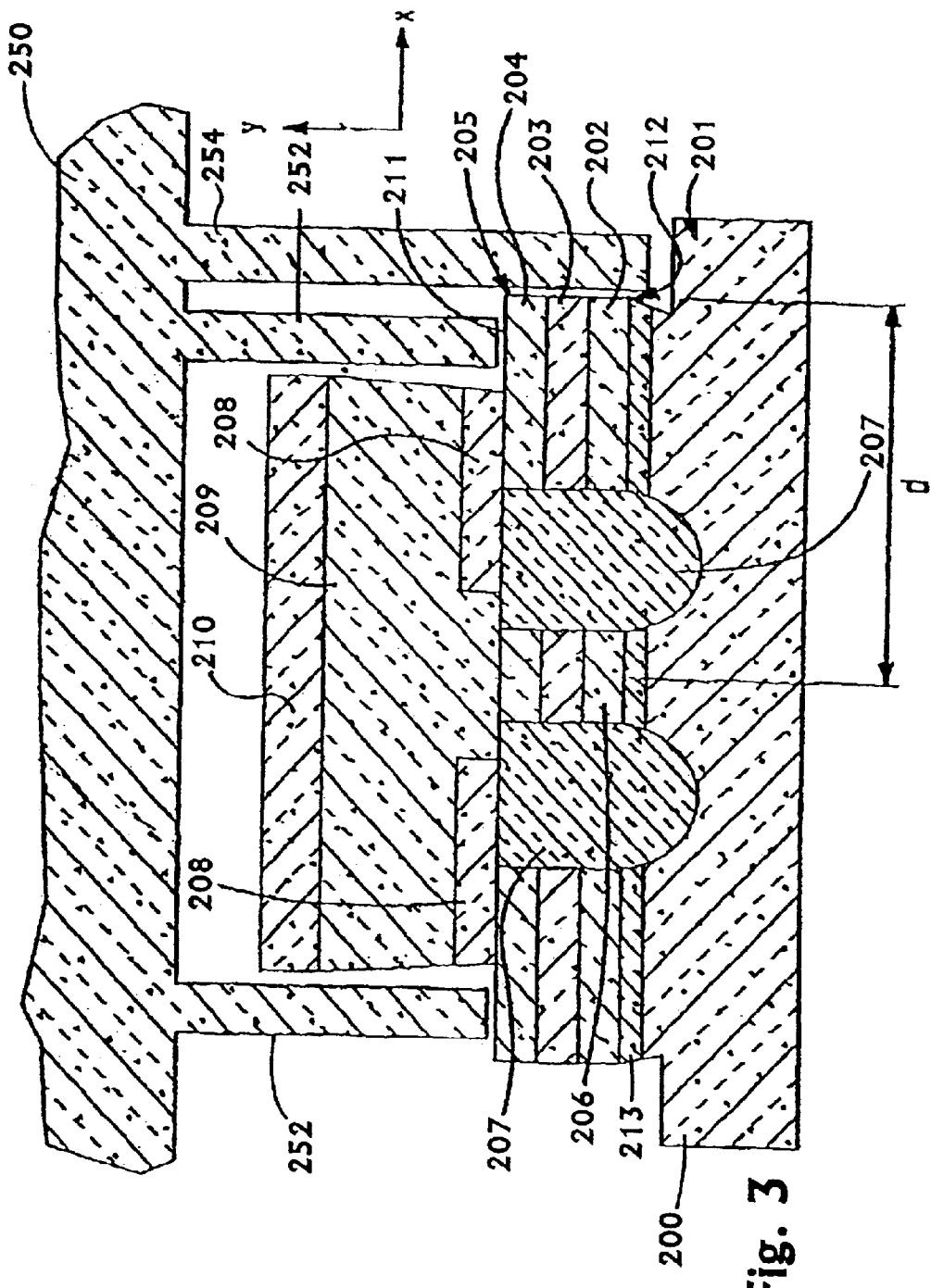
FIG. 3 is a cross-sectional view of the invention of the present disclosure showing the alignment fiducials on the silicon waferboard making contact with the device to effect the passive alignment by way of the alignment notch of the present invention.

FIG. 3 is a cross sectional view of an optoelectronic device fabricated in accordance with one embodiment of the present invention and a substrate on which it is to be mounted. In this example, the optoelectronic device is a buried heterostructure semiconductor laser 200, the substrate is a silicon waferboard 250, and the fiducial 205 is a mechanical fiducial. The silicon waferboard includes silicon vertical standoffs 252 and side pedestal 254 for aligning the laser 200 in the y and x directions, respectively, using mechanical fiducial 205 on the laser.

To this end, n-type InP substrate 201 has a buffer layer 213 an active quaternary layer 202, a cladding layer 203 and another quaternary layer 204 that forms an etch-stop alignment layer as discussed more fully below. A mechanical alignment fiducial in the form of a notch 205 also is shown. The mesa structure is shown generally at 206 with the InP blocking layers, which bury the mesa laterally, shown at 207 as well as blocking layers 208 which provide for current confinement so that current is prohibited from passing between the mesa and the side Q-active layer. A p-type burying layer is shown at 209 with the p-type contact layer at 210. The standoffs 252 contact the top surface 211 of the etch-stop alignment layer 204 for registration (alignment) in the y-direction (reference the coordinate axis shown). A second surface or a side surface 212 effects the alignment to a side pedestal 254 for registration (alignment) in the x-direction.

To be very clear, there are two surfaces which are used for alignment. The first surface is for height registration to standoffs 252, and is shown at 211. It is the top of the quaternary layer 204. A second surface is shown at 212 for registration in the x-direction. In the embodiment shown in FIG. 3, side surface 212 runs through quaternary layer 204, cladding layer 203, active layer 202 and buffer layer 213. It will be understood by those of skill in the art that the term notch is commonly used in the industry to denote apertures in layers of semiconductors. Therefore notches may have one or more vertical walls. For instance, a notch with a square cross-section (in a horizontal plane) would be considered to have four perpendicular surfaces (or walls). Since notch 205 in FIG. 3 happens to extend to the periphery of the die, it has only one side, i.e., side surface 212. However, a notch in accordance with the present invention may have any number of sides. If the fiducial will be used to achieve alignment mechanically (i.e, by contact) in only one direction, then one wall is adequate. If the fiducial is to be used to achieve alignment mechanically in two dimensions, then two walls is adequate.

Both the height registration (y-axis in FIG. 3) as well as the side registration to a pedestal 254 (x axis in FIG. 3) are effected very precisely by the invention of the present disclosure. To this end, the distance from the center of the mesa 206 to the side surface 212 is toleranced very tightly through the precision of photolithographic alignment and etching techniques. This is shown as a distance d in FIG. 3. Furthermore, the height registration which accurately aligns the active mesa 206, where light emission occurs, to an optical fiber in the y-direction is tightly controlled by the thickness between the active layer and the top surface 211 of the etch-stop alignment layer 204.

It is of particular importance to note that the etch-stop alignment layer in the present invention, through the use of selective etching, allows for the precision in the x-direction and, through precision growth techniques, allows for the precision alignment in the y-direction. Since the active region 202 of mesa 206 is defined by the same mask that defines the notch 205, namely, the mask used to create the windows through the etch-stop layer 204, any misalignment between the mechanical fiducial (notch 205, including surface 212) and the active region 202 of the mesa 206, which is the feature that ultimately is being aligned (with an optical fiber, for instance), is limited to the tolerance of a single mask. This tolerance is on the order of about 0.2 microns for many of the maskwork techniques in wide use today. Furthermore, a mask to mask alignment tolerance of about 0.1 microns is typical. As the number of masks between the mask used to define the feature that is ultimately being aligned and the mask used to define another feature relied upon for making that alignment increases, the accuracy of the alignment decreases accordingly. For example, if a fiducial relied upon in the alignment of the active region of a laser to a fiber was created by a different mask than the mask that defined the active region, then the tolerance of the alignment will be 0.2+0.2+0.1=0.5 microns (worst case). In this example, if the mask that defined the fiducial was aligned based upon a third mask, the alignment of which was based upon the mask that defined the active region, then the alignment tolerance would be 0.2+0.2+0.2+0.1+0.1=0.8 microns (worst case).

In the present invention, the etch-stop alignment layer 204 defines both the active region 202 of the mesa 206 and the notch side surface 212 with the same mask while allowing the notch 205 to be exposed even after regrowth of the InP blocking and burying layers that are used in the fabrication of a buried heterostructure so that the notch can, in fact, be used as a mechanical or a visual fiducial.

A fabrication process in accordance with the present invention is illustrated by FIGS. 4–20, with various embodiments disclosed. FIGS. 4–16 disclose embodiments in which the invention employed to create a notch such as notch 205 with edge 212, which can be used as a mechanical fiducial as described above in connection with the Armiento patent.

Figure 4:
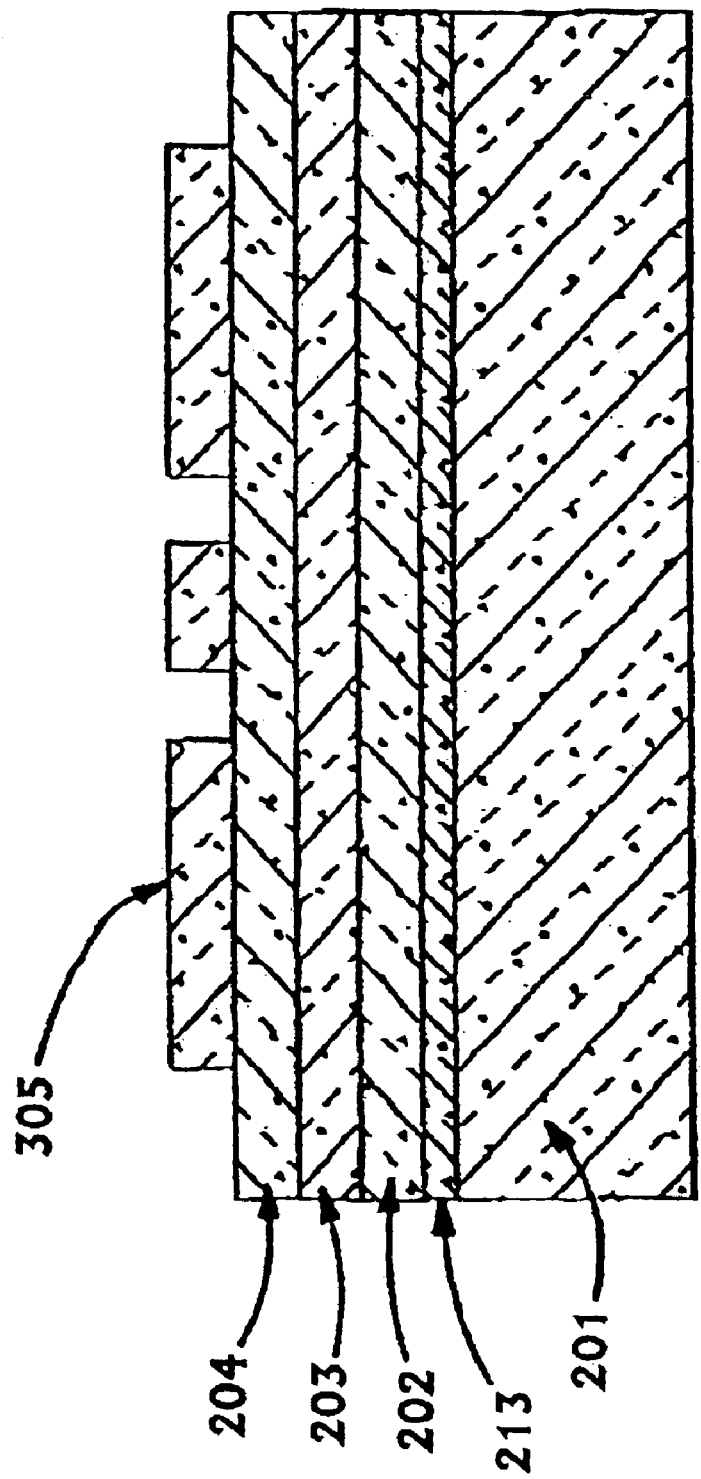
FIGS. 4–12 are cross sectional views of the various steps in effecting the fabrication of the invention of the present disclosure.

Turning to FIG. 4, the InP substrate 201, has disposed thereon an InP buffer layer 213, an InGaAsP bulk or multiple quantum well (MQW) quaternary active layer 202, an InP cladding layer 203, and a thin quaternary InGaAsP etch-stop alignment layer 204. A dielectric layer 305 such as $SiO_2$ or $Si_3N_4$ is deposited over the wafer using standard technique. A photolithography patterning step using conventional techniques is used to define openings in the $SiO_2$ or $Si_3N_4$ to form an etching mask corresponding to the alignment notch edge 212 and the laser waveguide mesa 206.

Figure 5:
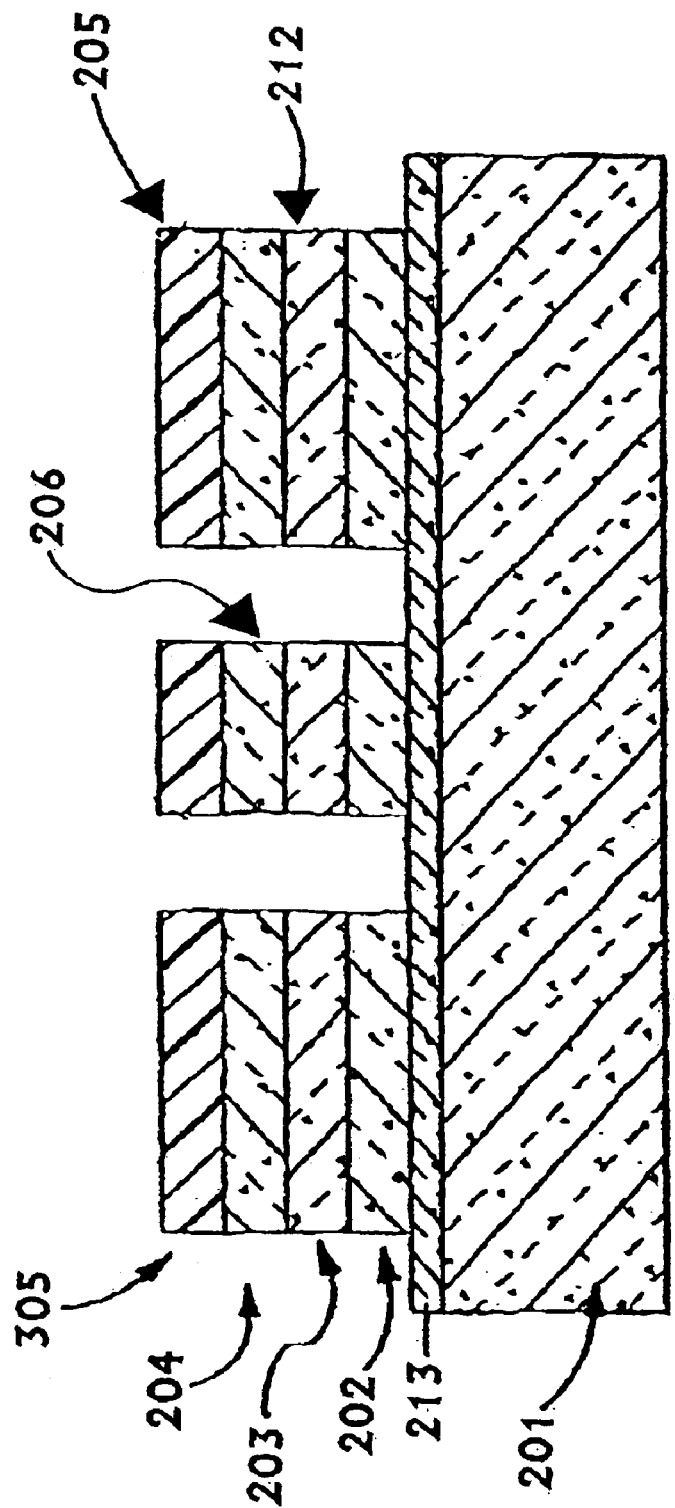
Figure 6:
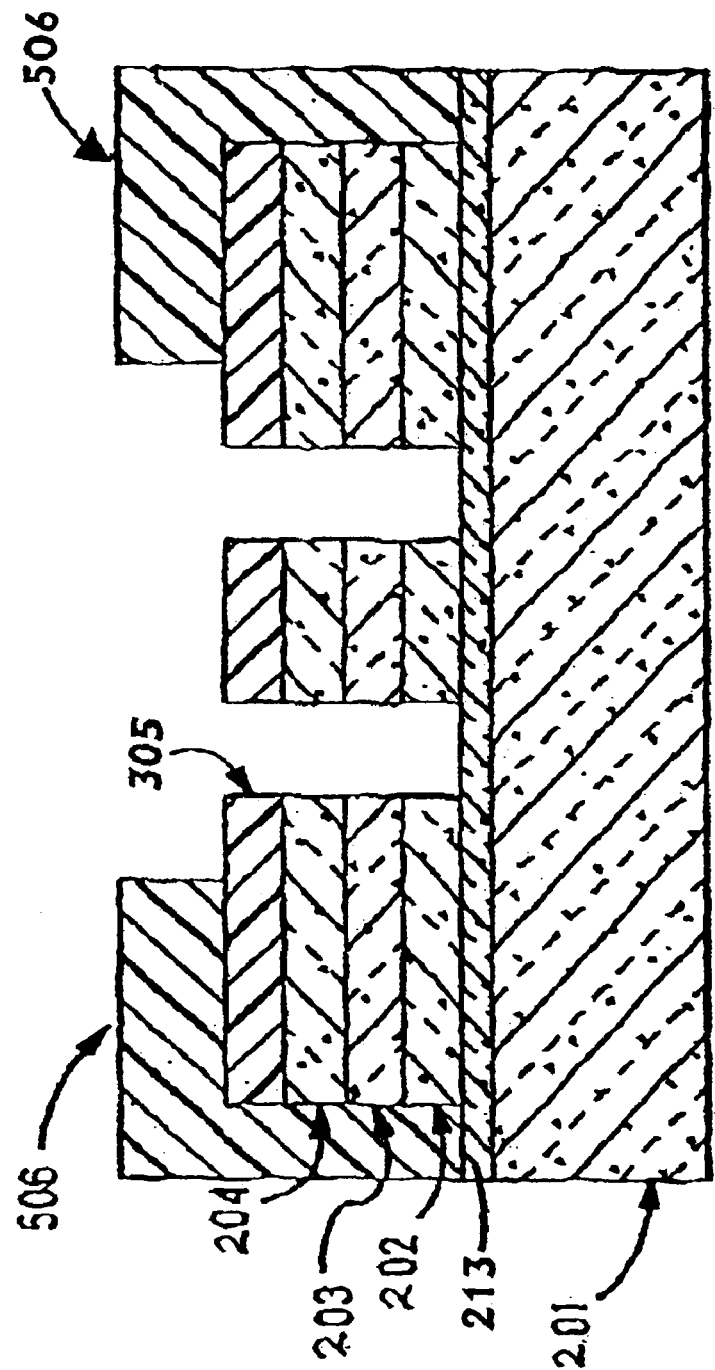
Figure 7:
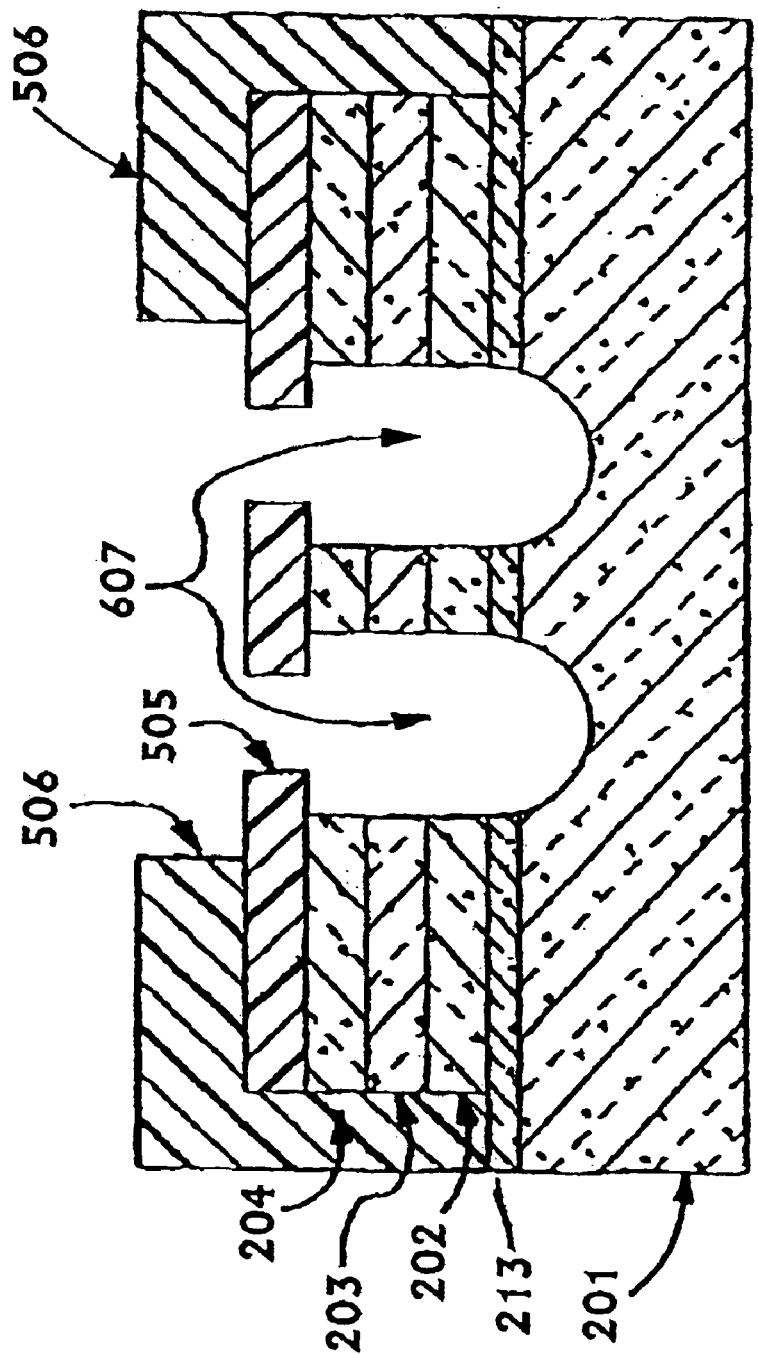

Turning to FIG. 5, a reactive ion or other suitable etching technique is then used to etch through the InGaAsP etch-stop alignment layer 204, the InP cladding layer 203, and the active layer 202 of the underlying structure to define the laser waveguide mesa 206 and the alignment notch edge 212. Turning to FIG. 6, photoresist 506 is next applied and patterned such that the region of the vicinity of the alignment notch is protected with photoresist, while the active mesa region is exposed for a subsequent etching step to further define the active mesa, as seen in FIG. 7. After the final mesa etching step, which utilizes an etchant which does not attack photoresist, the remaining photoresist is removed, leaving a structure which now incorporates a precisely located InGaAsP etch-stop alignment layer 204 upon which additional InP regrowths may be performed using conventional LPE or MOCVD techniques. This incorporated layer now functions as a precise etching mask for material selective etchants, such as HCl. Thereafter, as shown in FIG. 8, a layer of blocking material 207, InP, is deposited by metal-organic chemical vapor deposition (MOCVD) or grown by liquid phase epitaxy (LPE).

Figure 8:
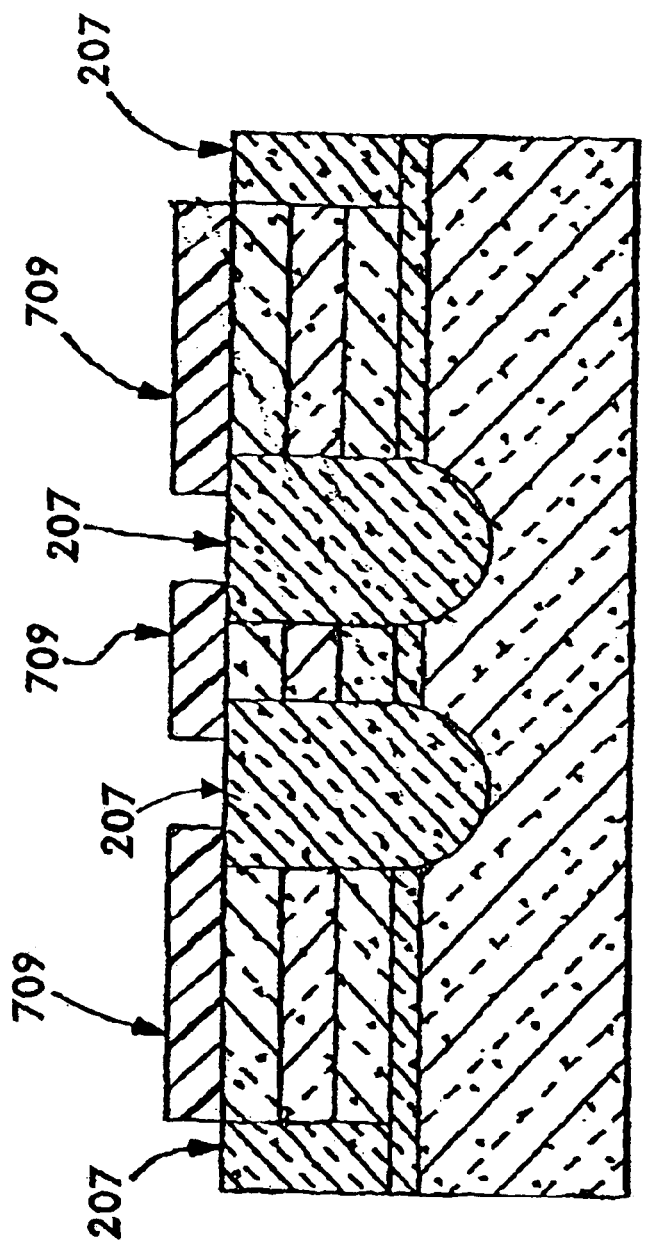
Figure 9:
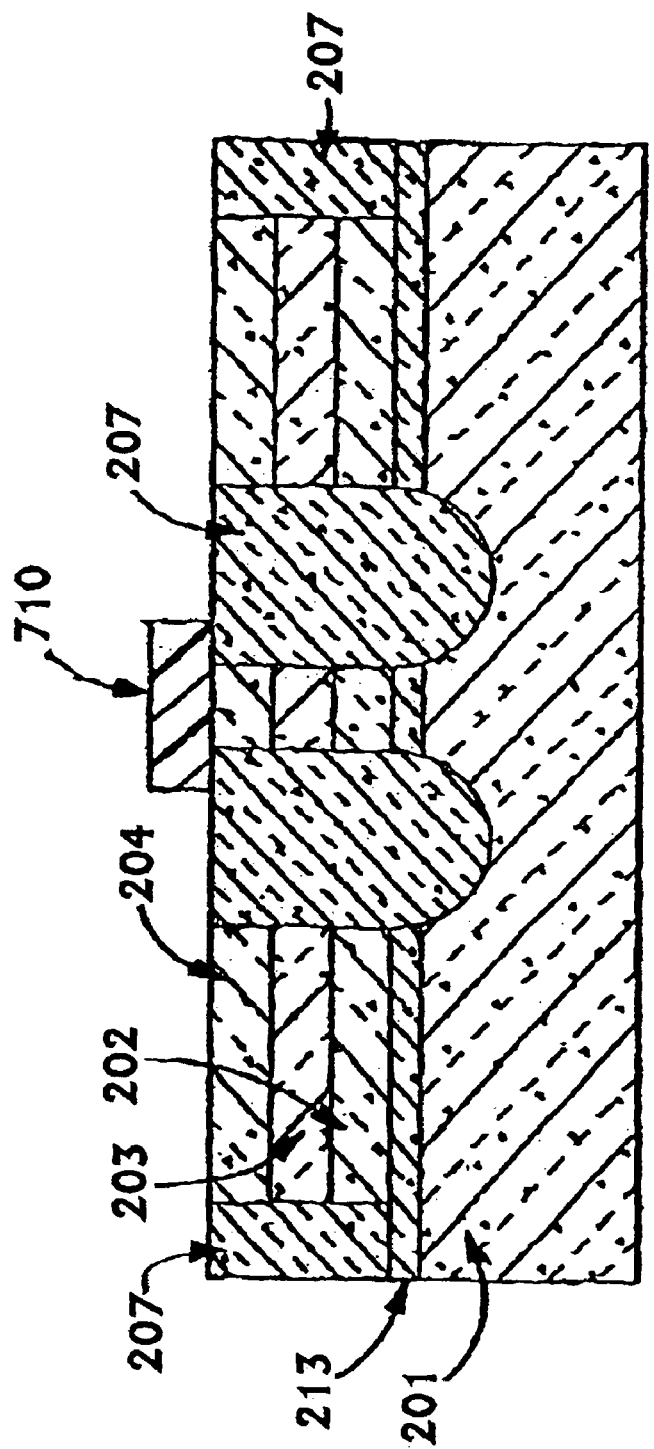
Figure 10:
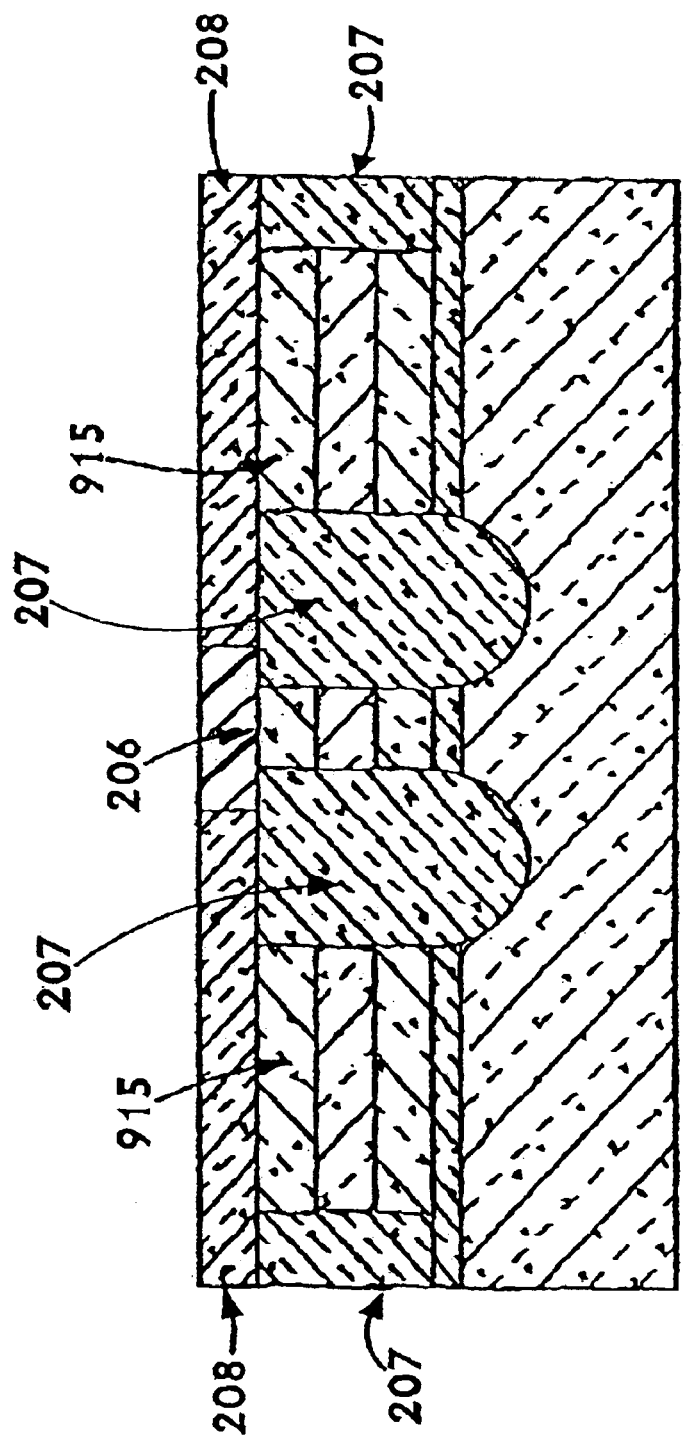

If MOCVD is used, a dielectric mask is utilized as is shown at 709 in FIG. 8. With the dielectric 709 as the mask, the MOCVD technique produces a nearly planarized InP blocking layer. The InP blocking layers may contain p-type InP, for example, if zinc is used as a dopant; n-type InP, for example, if sulfur is used as the dopant; and/or semi-insulating InP, for example, if the dopant is iron. To this end, multiple combinations of any of these three types of InP can, in fact, be used. These are shown as the blocking layers, and are effected in the first regrowth. By using a photoresist to protect the dielectric in the central portion of the chip, shown at 710, the dielectric shown at 709 on the sides of the chip are etched selectively from the surface. The resulting structure is as shown in FIG. 9 with the dielectric material shown at 710, the substrate at 201, the InP buffer layer at 306, the active layer at 202, the cladding layer at 203, the etch-stop alignment layer at 204, and the InP blocking layer at 207 and which correspond to the various layers in previous drawing figures.

After the first blocking layer regrowth is complete, a second InP blocking layer 208 is deposited. In the present discussion, MOCVD is utilized to effect this deposition. In addition, as before, the second InP blocking layer can be p-type, n-type or intrinsic InP or any multiple combinations of these three types of InP. This second layer of blocking material is used to block current flow between the side sections shown at 915 in FIG. 10 and the central mesa shown at 206. Furthermore, after the dielectric layer which covers the mesa 206 is removed, the p-type InP burying layer is deposited by MOCVD or grown by LPE techniques. Either of these techniques can thereafter be used to effect the growth or deposition of the InGaAsP p-contact layer.

Figure 11:
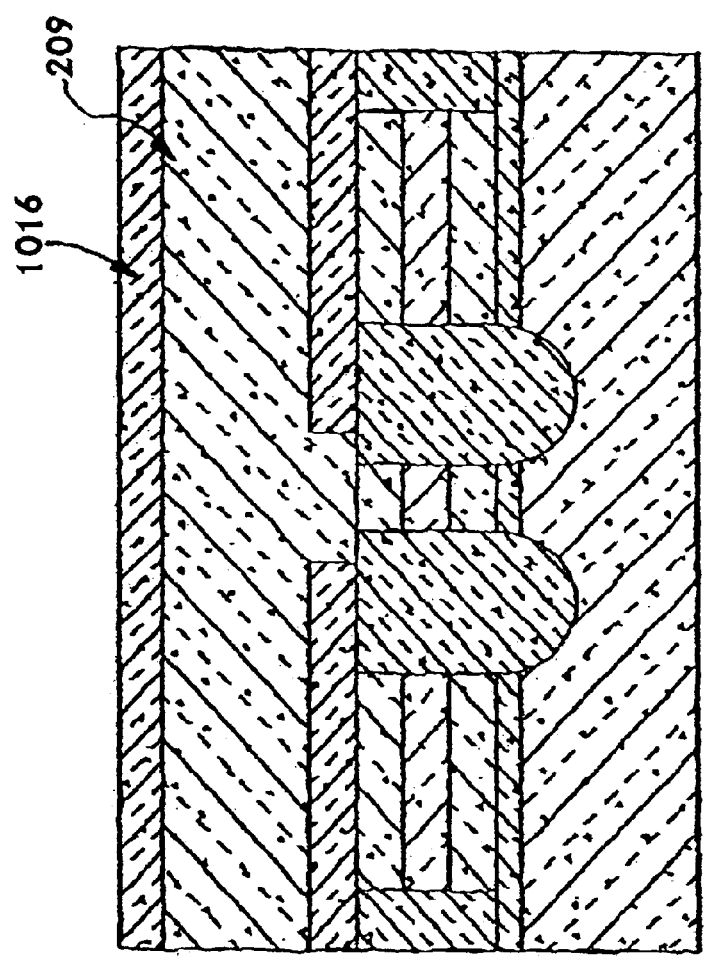
Figure 12:
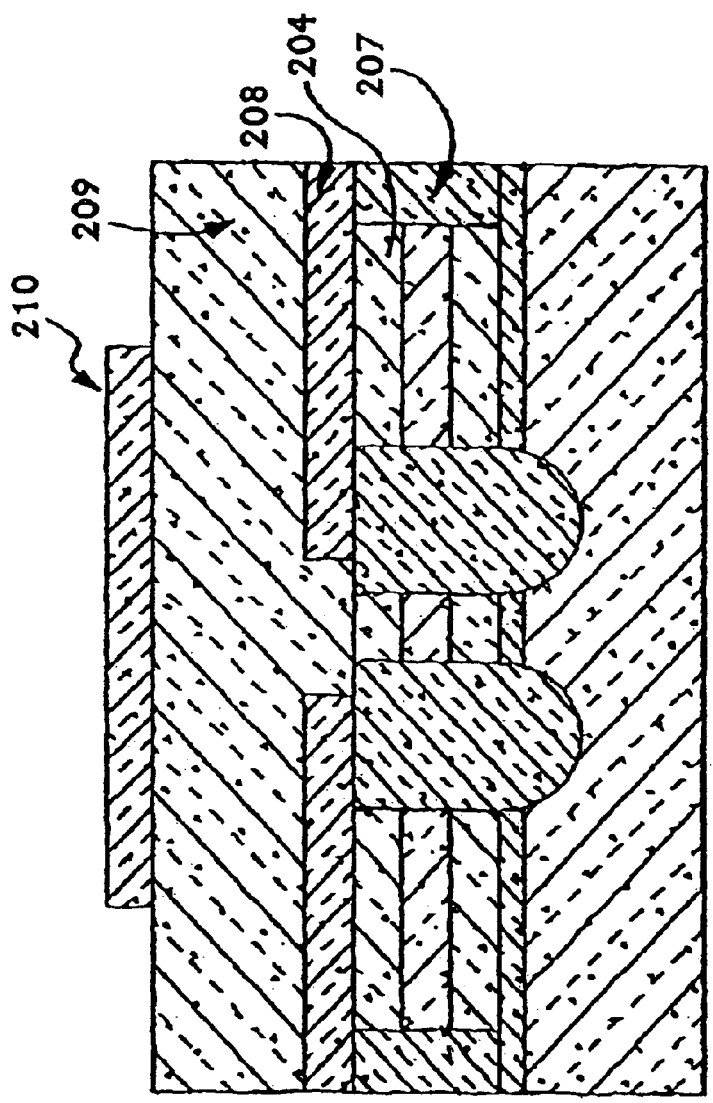
Figure 13:
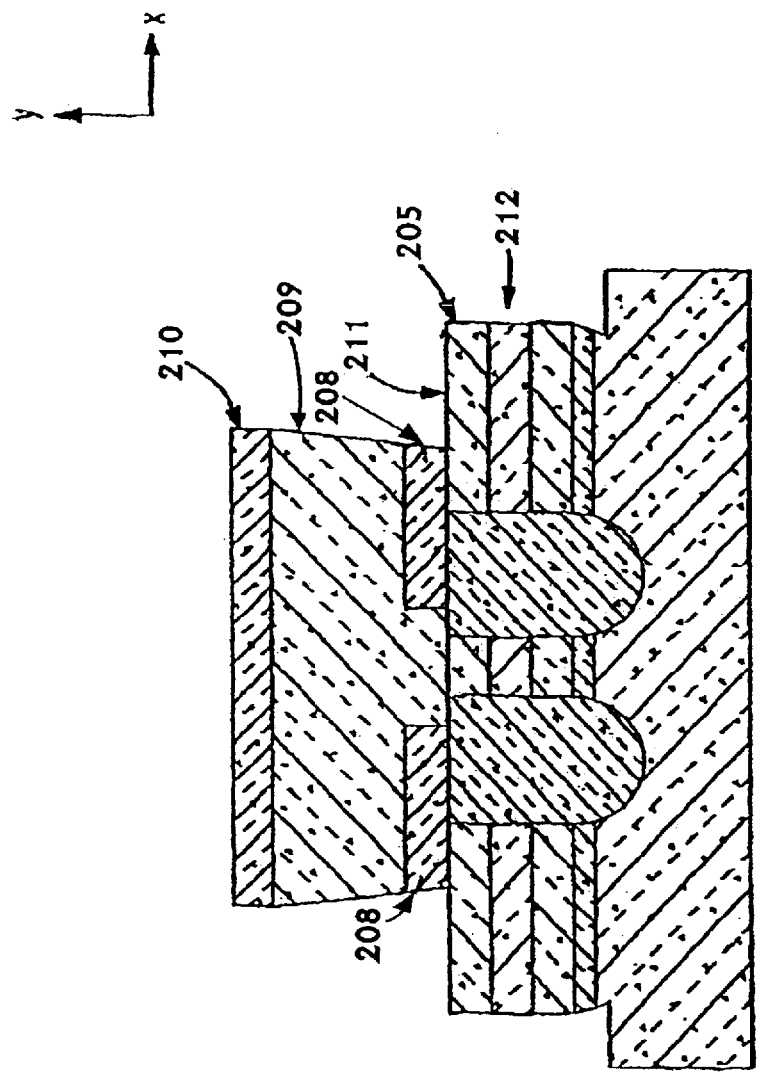
FIG. 13 is a cross sectional view of the buried heterostructure laser with the alignment notch of the present disclosure.

Referring to FIG. 11, the p-type burying layer is shown at 209 and the p-type contact layer is shown as 1016 in FIG. 11. Finally, in order to reveal the alignment notch for effecting the alignment of the notch with the silicon vertical standoffs 252 and side pedestal 254 on a silicon waferboard 250 (FIG. 3), the contact layer 1016 in FIG. 11 is partially etched as shown at 210 in FIG. 12. Using a solution of hydrochloric acid, for example, hydrochloric acid and water or a mixture of hydrochloric acid and phosphoric acid, the etch-stop alignment layer 204 is revealed by etching the InP burying layer and the InP blocking layers. This is shown in FIG. 13 with the etching revealing notch 205, including surfaces 211 and 212. The first surface 211 is for alignment in the y direction to standoffs (e.g., 252 in FIG. 3), while the side surface 212 of notch 212 is for registration in the x-direction to a side pedestal (e.g., 254 in FIG. 3). In this etching step to reveal surface 211 and the notch 205, selective etching is used whereby the InP is etched. To this end, the InP burying layer shown at 209, the second regrowth InP layer shown at 208 and the side layer of InP 207 effected in the first regrowth are selectively etched. This reveals the first surface 211, which receives the vertical standoffs 252 for y-direction registration as is shown in FIG. 13. Additionally, the notch along the side referenced as 205 in FIG. 13 is effected in this etch step. The side surface 212 is used for the registration in the x-direction to a side pedestal 254.

Figure 14:
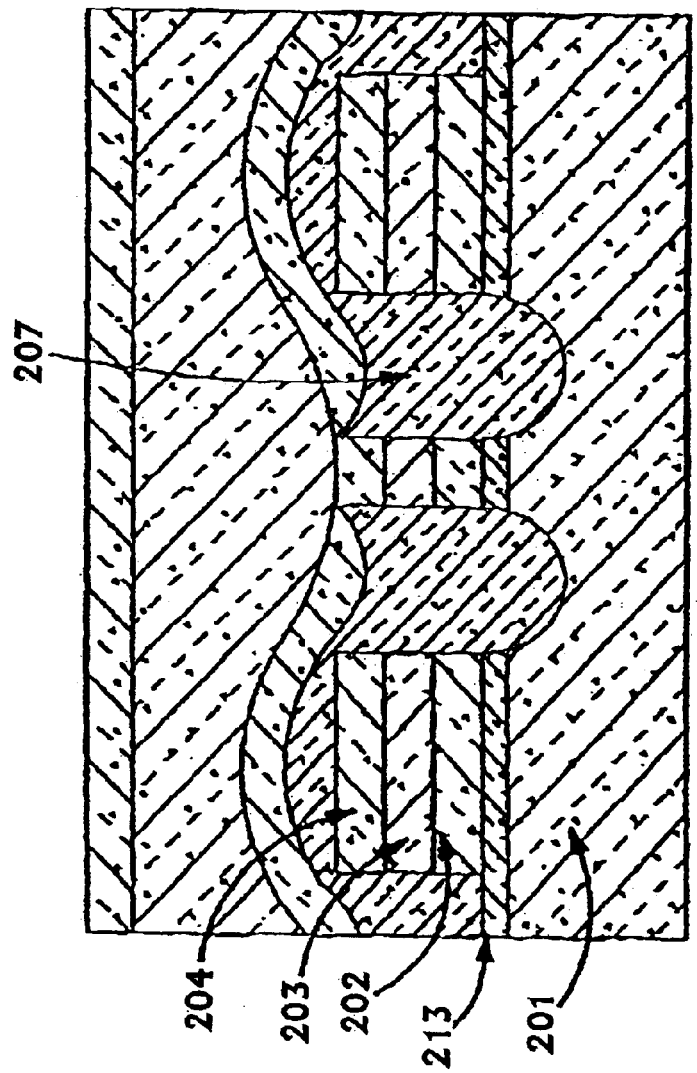
FIGS. 14–16 show the processing steps to effect an alternative embodiment of the invention of the present disclosure.
Figure 15:
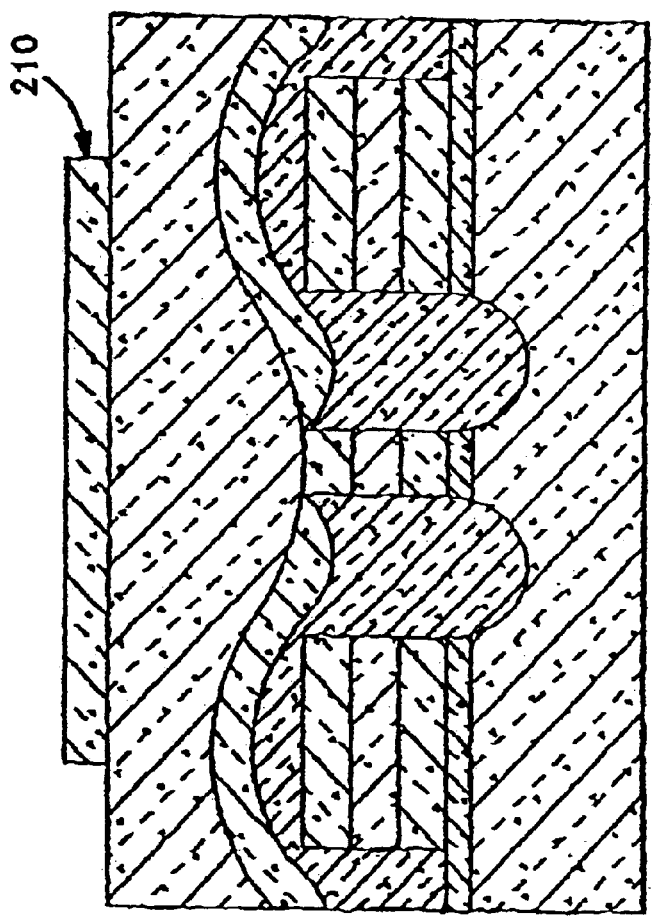
Figure 16:
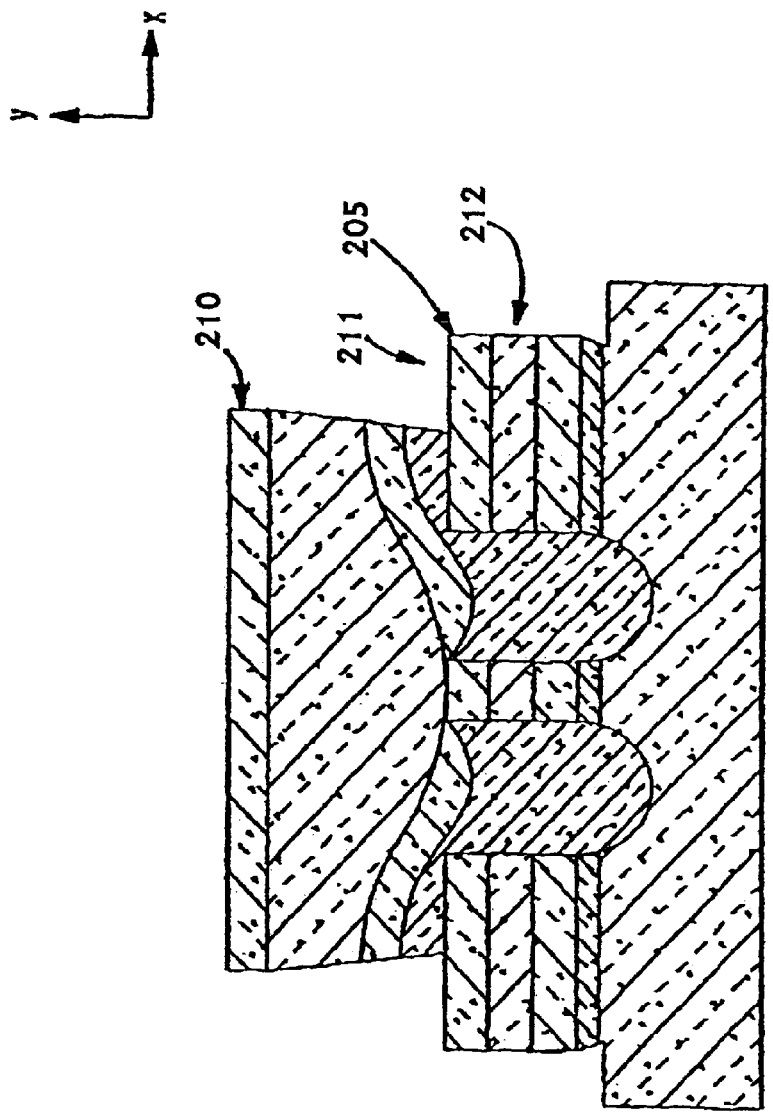

In the technique where LPE is used to grow the InP layers, the basic techniques used up to the step shown in FIG. 7 are carried out. With the structure shown in FIG. 7, the photoresist and dielectric, shown as 506 and 505, respectively, are removed. LPE is thereafter used to regrow p-type InP blocking layer, the n-type InP blocking layer and the p-type InP burying layer. Additionally, the p-type contact layers of InGaAs are also grown by LPE. The final structure after LPE is used to grow InP as well as the contact layers is shown in FIG. 14. Thereafter, a portion of the InGaAs contact layer is removed as shown at 210 in FIG. 15. Thereafter, using a solution of HCl which could be, again, HCl and water or HCl and H3PO4, the Q-alignment layers are revealed. This is shown in FIG. 16. Again, as shown in FIG. 16, a first surface 211 is revealed and enables the alignment in the y-direction as is shown in FIG. 16. Furthermore, as shown in FIG. 16, the side surface 212 and the alignment notch 205 as well as the region 210 are revealed through this second etching step which etches the InP, but does not etch the InGaAsP layers.

By virtue of the fact that the active and etch-stop alignment layers are defined at the same time by very precise photolithographic patterning and etching techniques to sub-micron accuracy, the accuracy in the x- and y-directions achieved by the present invention allows the edge emitting buried laser chips to be very accurately passively aligned to a single mode optical fiber, disposed on a silicon waferboard.

Figure 1:
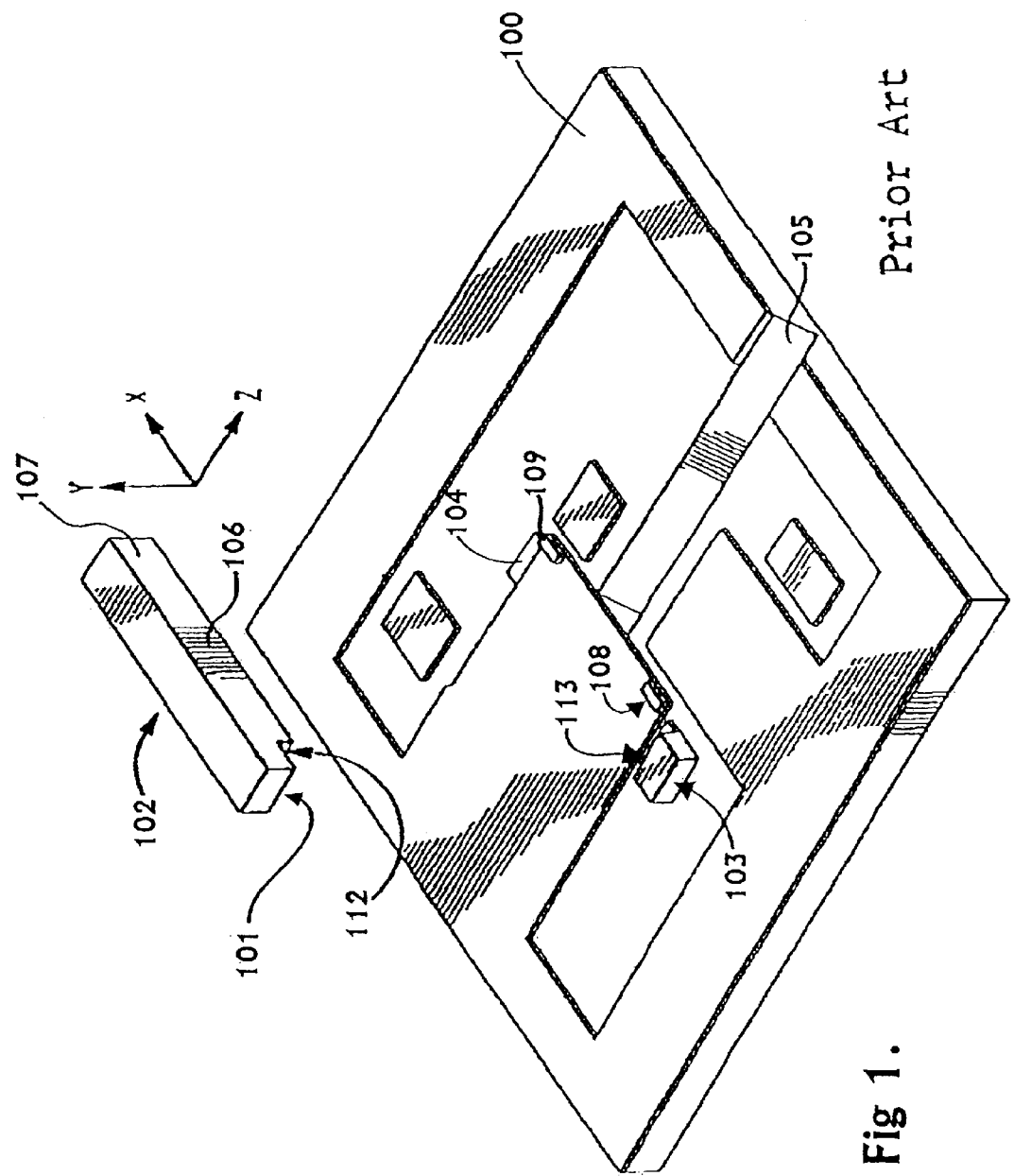
FIG. 1 is a perspective view of a prior art structure of a laser die with a notch defining a mechanical fiducial and a substrate of a silicon waferboard having corresponding mechanical fiducials.

While FIGS. 3–16 illustrate embodiments of the invention in which the fiducial being created is a mechanical fiducial, namely notch 205 with side surface 212, that can be used for passive alignment in accordance with the method described and shown in connection with FIG. 1, the invention is not limited to such application. The invention also can be applied to define visual fiducials such as two dimensional apertures such as the squares illustrated in FIG. 2C. Those squares can then be used for optical alignment as described in connection with FIGS. 2A–2C. For instance, the fabrication steps outlined in connection with FIGS. 3–16 could be followed essentially as previously described, with the only significant difference being that, the appropriate etch masks would define a square having four side walls, rather than merely a notch having only one side wall 212.

Figure 17:
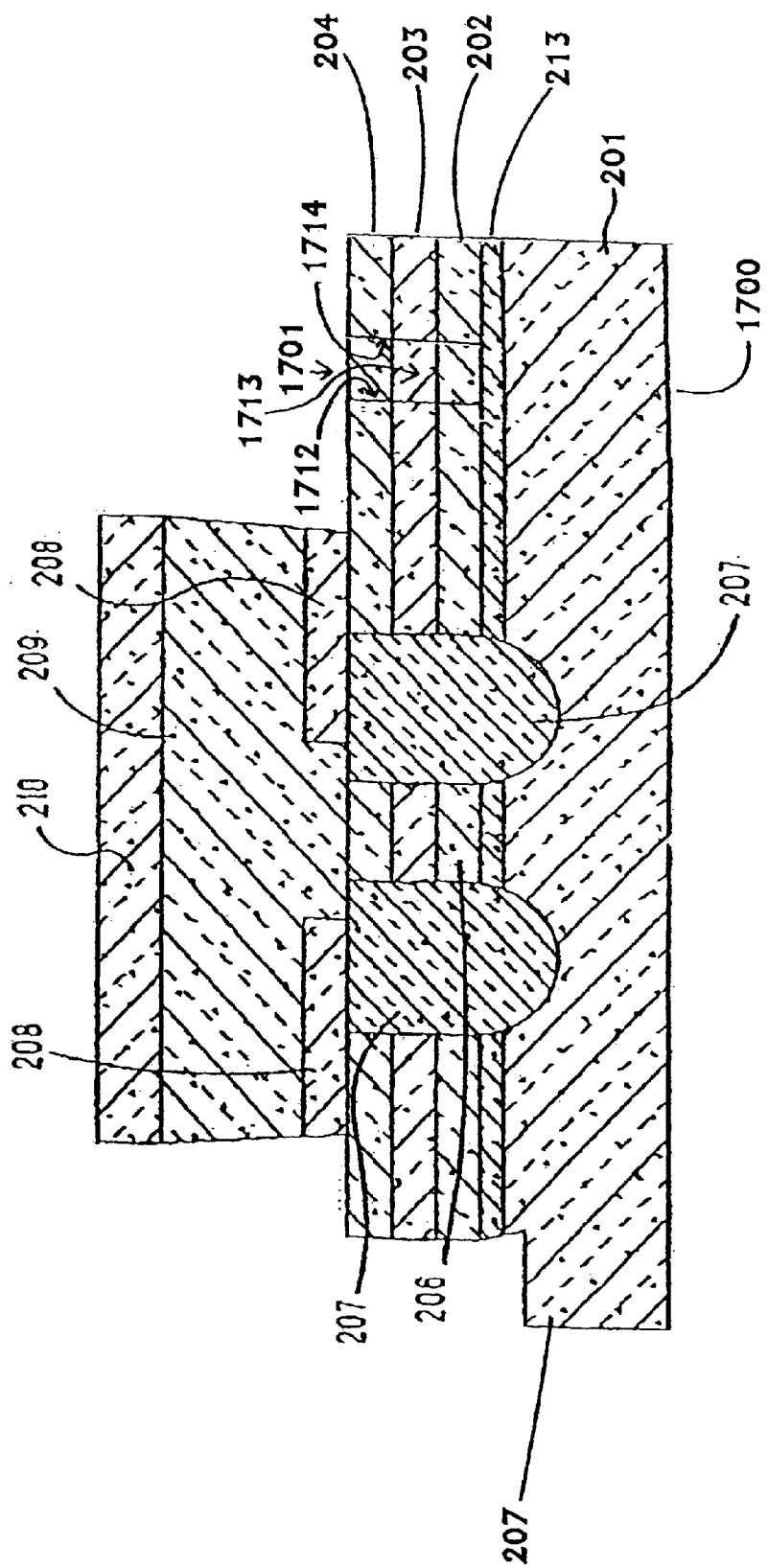
FIG. 17 is a cross-sectional view of an alternate embodiment of a die in accordance with the present invention.

FIG. 17 is a cross-sectional view of a laser die 1700 in accordance with this type of embodiment of the invention. FIG. 17 corresponds to FIG. 2 of the first disclosed embodiment of the invention. The laser die 1700 is essentially identical to the laser die 200 in FIG. 3 except that, instead of providing merely a notch 205 with a single side wall 212, the appropriate etch mask that defined the notch 205 in the FIG. 3 embodiment is replaced with a mask that instead defines a square void 1701 that is enclosed on all lateral sides by four lateral walls. Three of the walls, 1712, 1713, and 1714, are shown in the Figure. Since the Figure is a cross-section of the die, the fourth wall, which opposed wall 1713, cannot be seen. Also, in a practical embodiment, there would be at least a second void on the opposite side of the mesa from void 1701.

Figure 18:
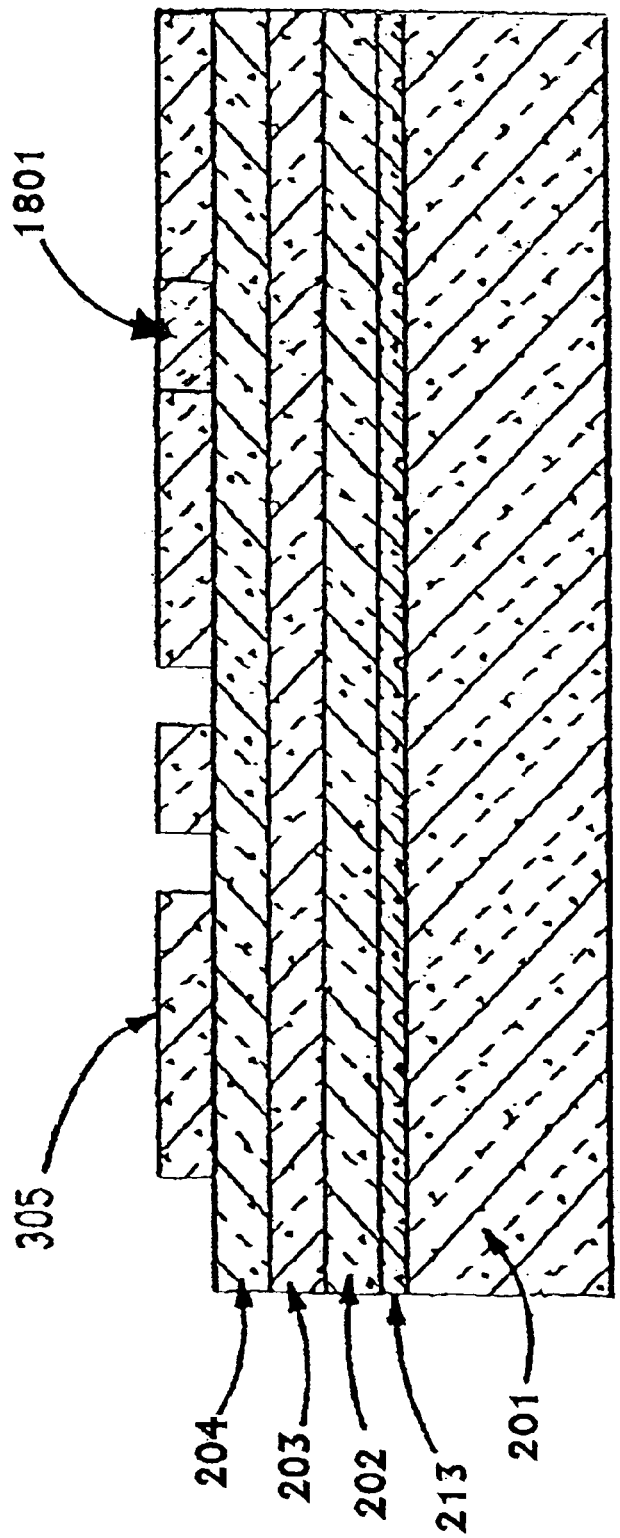
FIGS. 18 and 19 are cross-sectional views of a die at particular stages in effecting the fabrication of the embodiment of the invention shown in FIG. 17.
Figure 19:
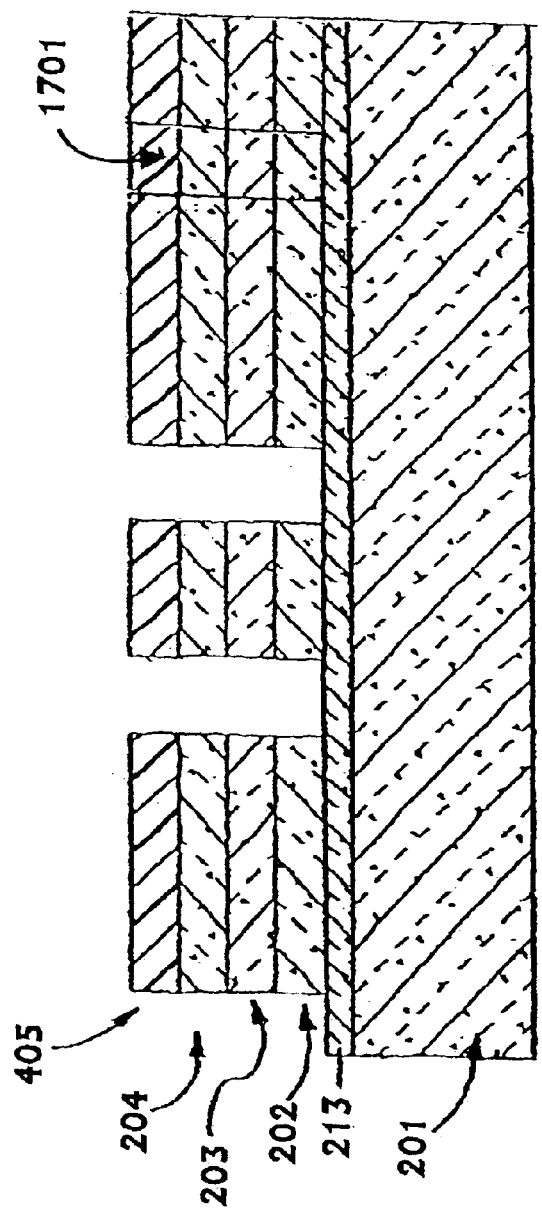

More specifically, referring to FIGS. 4, 5 and 18, the mask used in the photolithography step described in connection with FIG. 4 to create the openings in dielectric layer 305 would be replaced with a mask that defines opening 1801 as square, rather than merely allowing everything to the edge of the die to be etched (as in FIG. 4). Thereafter, the etching step described in connection with FIG. 5 is performed essentially as described in connection with FIG. 5. However, because the pattern in dielectric layer 305 is different, it creates the intermediate structure shown in FIG. 19 with void 1701, rather than the intermediate structure shown in FIG. 5. All subsequent processing steps as described in connection with FIGS. 5–16 remain essentially the same. The result is a two dimensional visual fiducial created in the same photolithography step that created the mesa and which can be used for optically aligning the laser die with corresponding visual fiducials created on a substrate, as described in connection with FIGS. 2A–2C.

The process of the present invention can further be adapted to embodiments in which metal pads are fabricated on the laser die for use in a solder reflow or similar surface tension alignment technique as described above. Specifically, the metal pads formed on the laser die must themselves be properly positioned relative to the mesa in order for the surface tension alignment technique to work. Extremely accurate alignment of the metal pads to the mesa can be achieved by using a structure created in accordance with the techniques described in this specification as a visual fiducial for aligning the mask(s) that defines the metal pads. In this manner, the metal pads will be aligned with the mesa with minimal error since they are aligned directly to a structure that was defined in the same photolithography step that defined the mesa. For instance, the visual fiducials fabricated as set forth above in connection with FIGS. 17–19 could just as easily have been used as visual fiducials for aligning the masks for defining the metal pads as they could for direct optical alignment of the laser die on the substrate.

Figure 20:
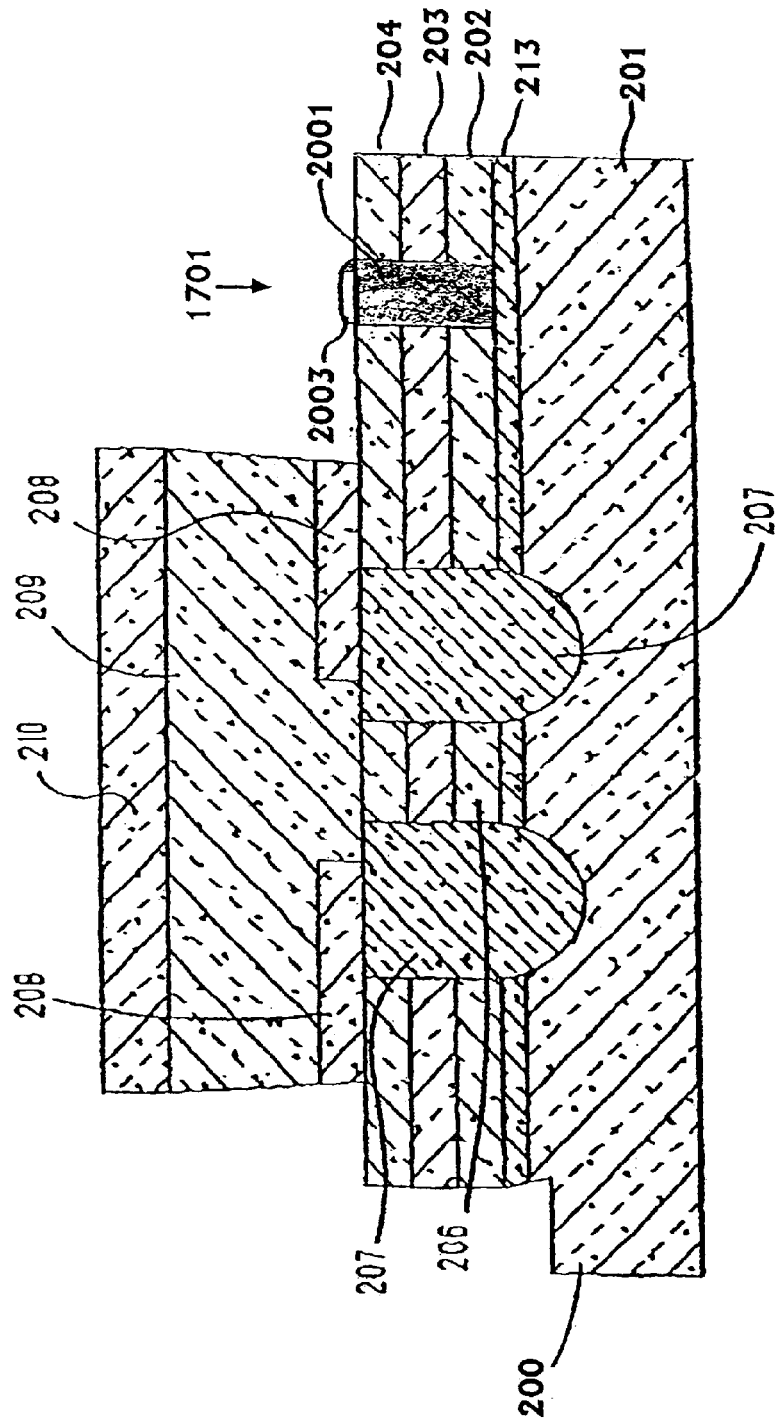
FIG. 20 is a cross-sectional view of a die in accordance with an even further embodiment of the present invention.

Even greater accuracy can be achieved in connection with surface tension alignment techniques by forming the metal pads and/or depositing solder directly in the voids created as described above in connection with FIGS. 17–19. FIG. 20 illustrates such an embodiment. In particular, void 1701 is filled with a deep metal pad 2001 which extends all the way from the top of layer 306, through layers 202, 203 and 204, to the top surface of layer 204. Then solder or other wettable material 2003 has been placed on top of the metal pad 2001. In alternate embodiments, the solder 2003 on the voids of the die may be omitted and instead be placed on the metal pads of the substrate onto which the die is to be mounted. In even further embodiments, solder or other wettable material might be placed both on the die voids and the substrate pads. The solder essentially would be positioned extremely accurately relative to the mesa since the mask that defined the mesa is the same mask that defined the position of the pads. Of course, there would be a separate mask used in the actual creation of the solder and/or metal pads in order to assure that the metal or solder is deposited only in the apertures. Nevertheless, the mask that defined the mesa and apertures would play a substantial role in defining the positions of the apertures.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A method for fabricating a light generating die with fiducials from a multi-layered structure comprising a substrate and an etch-stop layer, the method comprising the steps of:
   (1) depositing an etch-stop layer over said structure;
   (2) etching through said etch-stop layer and said structure to form an active mesa defined by cavities on either side and a fiducial, said fiducial comprising at least one feature positioned in a known spatial relation relative to said active mesa;
   (3) regrowing one or more layers on said structure;
   (4) selectively etching a portion of said regrowth layer to expose said fiducial; and
   (5) disposing a blocking layer in said cavities.

2. A method for fabricating a light generating die with fiducials from a multi-layered structure comprising a substrate and an etch-stop layer, the method comprising the steps of:
   (1) depositing an etch-stop layer over said structure;
   (2) etching through said etch-stop layer and said structure to form an active mesa and a fiducial, said fiducial comprising at least one feature positioned in a known spatial relation relative to said mesa;
   (3) growing one or more layers on said structure, wherein said one or more layers comprises a protective layer on said fiducial, and wherein said protective layer comprises blocking material; and
   (4) selectively etching a portion of said regrowth layer to expose said fiducial.

3. The method of claim 1, wherein said growing step comprises disposing a burying layer on a top surface of said etch-stop layer of said active mesa and on a top surface of said protective layer.

4. The method of claim 1, wherein said disposing of said blocking layer is by MOCVD.

5. The method of claim 1, wherein said disposing of said blocking layer is by LPE.

6. The method of claim 2, wherein said protective layer is disposed by MOCVD.

7. The method of claim 2, wherein said protective layer is disposed by LPE.

8. A light-generating die with fiducials obtainable from a process comprising the steps of:
   depositing an etch-stop layer over a multi-layered structure comprising a substrate and an etch-stop layer;
   etching through said etch-stop layer and said structure to form an active mesa and a fiducial, said fiducial comprising at least one feature positioned in a known spatial relation relative to said mesa;
   regrowing one or more layers on said structure; and
   selectively etching a portion of said regrowth layer to expose said fiducial.

9. A light-generating die with fiducials obtainable from a process comprising the steps of:
   forming a multi-layered structure comprising a substrate and an etch-stop layer by at least:
      providing a buffer layer on said substrate;
      growing a first quaternary layer on said buffer layer;
      growing a cladding layer on said first quaternary layer; and
      growing a second quaternary layer on said cladding layer, said second quaternary layer being said etch-stop layer;
   forming an active mesa and a fiducial on said structure, said active mesa being defined at least partially by etched cavities surrounding it, said fiducial comprising at least one feature positioned in a known spatial relation relative to said mesa, wherein said step of forming comprises at least:
      etching through said etch-stop layer and said structure using reactive ion etching
      disposing a photoresist over said fiducial;
      further etching said structure and said active mesa to form etched cavities surround said active mesa;
      removing said etch mask and said photoresist to expose said fiducial; and
      disposing a blocking layer in the etched cavities defining said active mesa regrowing one or more layers on said structure by at least;
      disposing protective layers on said fiducial, and
      disposing a burying layer on said active mesa by MOCVD or LPE; and
   selectively etching a portion of said regrowth layer to expose said fiducial.

10. A light-generating die having fiducials and being obtainable by a process comprising the steps of:
    depositing an etch-stop layer over a multi-layered structure comprising a substrate and an etch-stop layer;
    etching through said etch-stop layer and said structure to form an active mesa and at least two fiducials, each fiducial comprising at least one feature positioned in a known spatial relation relative to said mesa, each fiducial being a visual fiducial comprising a void in said multilayer structure having visible features in at least two dimensions;
    regrowing one or more layers on said structure; selectively etching a portion of said regrowth layer to expose said fiducial; and
    placing a wettable material in said voids of fiducials.

11. A light-generating die having fiducials and being obtainable by a process comprising the steps of:
    depositing an etch-stop layer over a multi-layered structure comprising a substrate and an etch-stop layer;
    etching through said etch-stop layer and said structure to form an active mesa and at least two fiducials, each fiducial comprising at least one feature positioned in a known spatial relation relative to said mesa, each fiducial being a visual fiducial comprising a void in said multilayer structure having visible features in at least two dimensions;
    regrowing one or more layers on said structure; selectively etching a portion of said regrowth layer to expose said fiducial; and
    forming metal pads in said voids.

12. A subassembly comprising said die of claim 10 mounted on a substrate having a plurality of pads, said subassembly obtainable by a process comprising the steps of:
    placing said die on said substrate such that each said void on said die roughly overlays one of said plurality of pads on said substrate; and
    melting said wettable material, whereby each of said pads on said die is brought into fine alignment with said mating pad on said substrate via surface tension of said wettable material.

13. A subassembly comprising the die of claim 11 mounted on a substrate having a plurality of pads, said subassembly being obtainable by a process comprising the steps of:
    placing said die on said substrate such that each said void on said die roughly overlays a pad of said plurality of pads on said substrate; and melting said wettable material, whereby each of said pads on said die are brought into fine alignment with said mating pad on said substrate via surface tension of said wettable material.

14. A subassembly comprising the light-generating die of claim 10 mounted to a substrate having metal pads positioned to mate with said voids on said die, said subassembly being obtainable by a process comprising the steps of:

forming metal pads in said voids and then placing said wettable material on said metal pads;

placing said die on said substrate such that each said void on said die roughly overlays said mating metal pad on said substrate; and melting said wettable material, whereby each of said metal pads on said die is brought into fine alignment with said mating metal pad on said substrate via surface tension of said wettable material.

* * * * *